United States Patent [19]

Sugawara et al.

[11] 4,212,024

[45] Jul. 8, 1980

[54] SOLID-STATE SWITCHING CIRCUIT EMPLOYING PHOTON COUPLING SUITABLE FOR CONSTRUCTION IN FORM OF INTEGRATED CIRCUIT

[75] Inventors: Yoshitaka Sugawara; Tatsuya Kamei, both of Hitachi, Japan

[73] Assignee: Hitachi, Ltd., Japan

[21] Appl. No.: 902,498

[22] Filed: May 3, 1978

[30] Foreign Application Priority Data

May 11, 1977 [JP] Japan .................................. 52/53147

[51] Int. Cl.² ............................................. H01L 29/74
[52] U.S. Cl. ....................................... 357/38; 357/30; 307/311; 307/303; 307/305
[58] Field of Search ....................... 307/311, 303, 305; 357/30, 38

[56] References Cited

U.S. PATENT DOCUMENTS

| | | | |
|---|---|---|---|
| 4,039,863 | 8/1977 | Okhinota et al. | 307/252 A |
| 4,084,110 | 4/1978 | Okuhara et al. | 307/252 G |

*Primary Examiner*—Martin H. Edlow
*Attorney, Agent, or Firm*—Craig & Antonelli

[57] ABSTRACT

A solid-state switching circuit employing photon coupling, which is controlled by a control signal, comprises a control portion which includes at least one light-emitting diode and a load current carrying portion which is formed on a di-electric isolated substrate. The load current carrying portion has a light-activated silicon controlled rectifier, the switching operation of which is controlled by photons emitted from the light-emitting diode. A transistor and a resistor are connected between the gate terminal and the cathode terminal of the light-activated silicon controlled rectifier in parallel to each other. Between the base and the emitter electrodes of the transistor, a photodiode is connected, and between the electrode connected to the n-base layer and the gate electrode of the light-activated silicon controlled rectifier, a diode is connected. And the photodiode is also activated by the photons emitted from the light-emitting diode.

4 Claims, 5 Drawing Figures

SOLID-STATE SWITCHING CIRCUIT EMPLOYING PHOTON COUPLING SUITABLE FOR CONSTRUCTION IN FORM OF INTEGRATED CIRCUIT

BACKGROUND OF THE INVENTION

The present invention relates to a switching circuit employing a photon coupling between a control portion and a load current carrying portion. The present invention may be used as electronic switches substituting for crossbar switches of conventional electromechanical relays in a communication system.

In order to acquire electronic switching circuits which substitute for conventional electromechanical relays, great efforts have been exerted. For example, U.S. Pat. No. 3,816,763 discloses solid-state relays which exploit photon coupling. Each of the solid-state relays has a control portion and a load current carrying portion. The control portion includes a light emitting diode (LED) and a current controller which controls current supplied to a photon generator, that is LED. In the load current carrying portion, a diode bridge for rectifying an alternating current produces direct current between positive and negative DC conductors. A photon-activated switching means, for example a light-activated silicon controlled rectifier (LASCR) switches the rectified load current between the DC conductors. Triggering energy for the LASCR is supplied by the photons radiating from the LASCR.

The switching sensitivity of the LASCR is controlled by a means for controlling the gate electrode current flow, which includes a bias signal-responsive variable impedance device, for example an NPN transistor. The NPN transistor is connected in a series circuit relation with the gate electrode of the LASCR by the connection of NPN transistor's collector electrode to the gate electrode. An emitter electrode connects to a cathode electrode of the LASCR. Bias signals are introduced through a base electrode of the transistor. To provide for switching at or near the point of zero instantaneous amplitude of the voltage between the load current terminals, a bias signal generating means, connected to the load current terminals, supplies a control signal to the means for controlling the gate electrode current. The bias signal generating means and the means for controlling the gate electrode current thereby vary the switching sensitivity of the photon-activated switching means to provide for the desired zero voltage switching.

When the instantaneous amplitude of the voltage present between the load current terminals is at or near zero, the bias signal generating means provides an inadequate bias signal to the means for controlling the gate electrode current, and it does not drain significant photon-generated current from the gate electrode. Under these conditions, the photon-activated switching means is the most sensitive for triggering by photons.

Such zero voltage switching photon coupled relay as mentioned above, however, has drawbacks as follows. When sufficient voltage appears between the load current terminals, the bias signal generating means provides an adequate signal for overcoming the threshold of operation of the means for controlling the gate electrode current, and any photon-generated current is effectively drained from the gate electrode. As a result, the photon-activated switching means then is rendered insensitive to triggering by the photons emitted from the photon generator. Further, the photons radiated from the photon generator impinge on the gate electrode of the LASCR, and simultaneously, erroneously impinge on the NPN transistor to bring it into the conductive state. In that case, even when the bias signal generating means is providing the inadequate bias signal, the transistor falls into the conductive state. Therefore, even in case where the instantaneous amplitude of the voltage between the load current terminals is at or near zero, the desired switching sensitivity is not attained. This is particularly true when the load current carrying portions of such relays are fabricated in the form of an integrated circuit (IC) on a single silicon chip.

In order to eliminate the disadvantage as in the latter, it has heretofore been executed to evaporate a metallic film on the NPN transistor so as to optically cut it off. In that case, however, such an NPN transistor requires a comparatively large area on an IC substrate. This leads to the disadvantage of conspicuously lowering the density of integration of such an IC.

In "SCR MANUAL" (furnished by G. E.), especially FIG. 4. 12 thereof, a silicon controlled rectifier (SCR) circuit which has a transistorized dynamic snubber to improve dv/dt withstand capability is disclosed. According to this circuit, in order to improve the dv/dt withstand capability of the SCR, a first transistor is disposed between a gate electrode and a cathode electrode of the SCR. A base electrode of the first transistor is connected to a cathode electrode of a second transistor, and also to an anode electrode of the SCR through a series connection of a capacitor and a resistor. The gate electrode of the SCR is connected to a collector electrode of the first transistor and a base electrode of the second transistor. The series connection of the capacitor and the resistor supplies current to the base electrode of the first transistor turning it "on" when anode voltage is rising.

The circuit as stated above, however, has the following disadvantages. Since such a circuit includes the capacitor therein, it is unsuitable for an IC. In addition, this circuit is unsuitable for a switching circuit which controls a relatively high power switched current output with a relatively low power control signal input, because the control portion and the load current carrying portion thereof are not electrically isolated perfectly.

Other relevant prior arts are as follows:
(1) U.S. Pat. No. 3,723,769 "Solid State Relay Circuit with Optical Isolation and Zero-cross Firing" (patented Mar. 27, 1973);
(2) U.S. Pat. No. 3,504,131 "Switching Network" (patented Mar. 31, 1970); and
(3) U.S. Pat. No. 3,413,480 "Electro-optical Transistor Switching Device" (patented Nov. 26, 1963).

SUMMARY OF THE INVENTION

An object of the present invention is to provide an improved solid state switching circuit employing a photon coupling.

Another object of the present invention is to provide a solid state switching circuit suitable for being put into the form of an IC.

These objects have been achieved by a solid state circuit employing photon coupling suitable for construction in form of integrated circuit comprising: at least one light emitting diode for radiating photons in response to control signal supplied thereto; a light-activated silicon controlled rectifier, the switching operation of which is controlled by the photons radiated from said light emitting diode; a transistor, the collector terminal and the emitter terminal of which are connected to the gate electrode and the cathode electrode of said light-activated silicon controlled rectifier, respectively; a diode connected between the n-base layer of the light-activated silicon controlled rectifier and the base terminal of said transistor; and a photodiode connected between the base terminal and the emitter terminal of said transistor, and being controlled by the photons radiated from said light emitting diode.

DETAILED DESCRIPTION OF THE PREFERRED EMBODIMENTS

Figure 1:
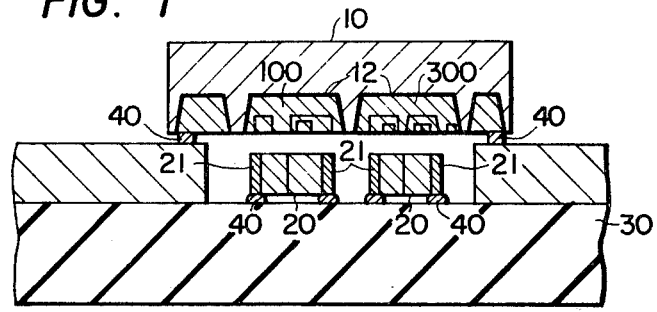
FIG. 1 is a sectional view illustrative of a switching circuit according to this invention as is put into the form of an IC.
Figure 2:
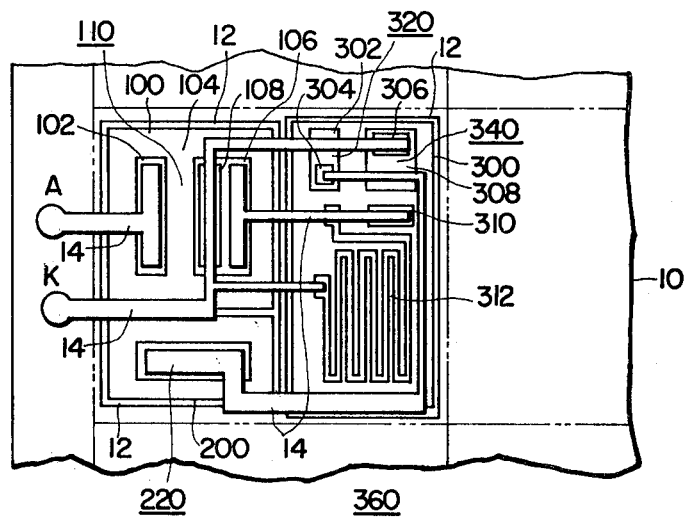
FIG. 2 is a plan view of a load current carrying portion of the switching circuit shown in FIG. 1 as is formed on a silicon substrate.

FIGS. 1 and 2 illustrate an embodiment of a switching circuit according to this invention. In general, a switching circuit employing photon coupling consists of a load current carrying portion and a control portion. A plurality of load current carrying portions are formed in the shape of an IC on a dielectric isolated substrate 10. The control portions are constructed of light emitting diodes (LEDs) 20. The dielectric isolated substrate 10 and the LEDs 20 are mounted on a double-layer ceramic substrate 30 through low melting point materials 40 of, e.g., Pb-Sn in a manner to oppose to each other. The load current carrying portions on the dielectric isolated substrate 10 are controlled by photons which are radiated from the control portions, i.e., LEDs 20.

FIG. 2 particularly shows the load current carrying portions formed as the IC in the surface of the dielectric isolated substrate 10, and in order to facilitate understanding, it depicts only one load current carrying portion in detail. On the dielectric isolated substrate 10 made of polycrystalline silicon, there are formed isolated regions 100, 200 and 300 which are made of single crystalline silicon and which are enclosed with silicon dioxide ($SiO_2$) films 12. In the isolated region 100, a light-activated silicon controlled rectifier (LASCR) 110 is formed of a p-emitter layer 102, an n-base layer 104, a p-base layer 106 and an n-emitter layer 108. In the isolated region 200, a diode 220 is formed of an n-layer 202 and a p-layer 204. In the isolated region 300, a photodiode 320 is formed of a p-layer 302 and an n+-layer 304, a transistor 340 is formed of an n-emitter layer 306, a p-base layer 308 and an n+-collector layer 310, and a resistor 360 is formed of a p-layer 312. In this figure, an aluminum electrode is denoted by reference numeral 14.

The LED 20 in FIG. 1 is constituted of an n-layer and a p-layer of, for example, gallium arsenide (GaAs). Reference numeral 21 designates an electrode of, for example, aluminum.

Figure 3:
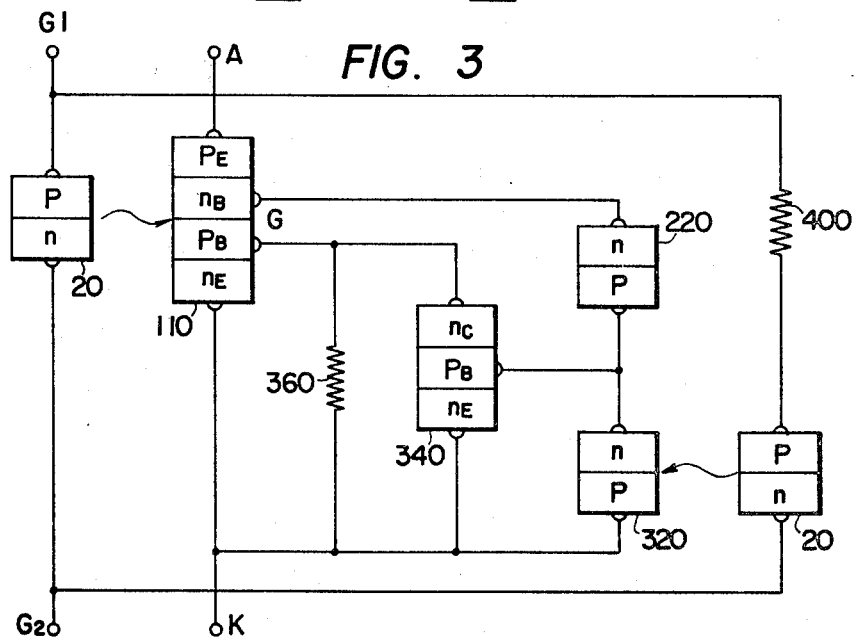
FIG. 3 is a schematic diagram of the switching circuit shown in FIGS. 1 and 2.

A schematic circuit diagram of FIG. 3 illustrates the load current carrying portion formed in the surface of the dielectric isolated substrate 10 and the control portion made up of the LEDs 20, of the switching circuit shown in FIGS. 1 and 2. One of the LEDs is connected between gate terminals G1 and G2 across which a control signal from a control circuit (not shown) is supplied, while the other LED is connected between the gate terminals G1 and G2 through a resistor 400 which is not depicted in FIGS. 1 and 2. These LEDs 20 emit photons in response to the control signal from the control circuit.

An anode terminal A and a cathode terminal K of the LASCR 110 are respectively connected to, for example, conductors (not shown) of a switching network in a communication system. A collector terminal and an emitter terminal of the transistor 340 are respectively connected to a gate terminal G and the cathode terminal K of the LASCR 110. Between the gate terminal G and the cathode terminal K of the LASCR 110, the resistor 360 is connected in parallel with the transistor 340. The photodiode 320 is connected between a base terminal and the emitter terminal of the transistor 340. The diode 220 is connected between a terminal led out from the n-base layer of the LASCR 110 and the base terminal of the transistor 340. The LASCR 110 and the photodiode 320 are optically coupled with the LEDs 20 respectively.

As set forth above, the circuit which consists of the photodiode 320, the diode 220, the transistor 340 and the resistor 360 is disposed in order to enhance the dv/dt withstand capability of the LASCR 110. This circuit is suitable for fabrication in the form of an IC. More specifically, as shown in FIG. 2, the transistor 340 and the photodiode 320 are formed within the identical isolated region 300. The photodiode 320 is made up of the p-layer 302 and the n+-layer 304, and is electrically isolated from the transistor 340 by this p-layer. The density of integration can be raised by forming the photodiode 320 and the transistor 340 within the identical isolated region 300 in this manner.

The photodiode 320 is small in the occupying area on an IC substrate when compared with other photosensitive elements, for example, a phototransistor. By employing the photodiode 320 as the photosensitive element, therefore, the density of integration can be more enhanced. Besides, the photodiode 320 is easier in fabrication than the phototransistor.

The operation of the switching circuit described above will now be explained. In case where a voltage of abrupt rise is applied across the anode terminal A and a cathode terminal K of the LASCR 110, a capacitive induction current is induced in the n-p junction of the diode 220. The capacitive induced current flows into the base of the transistor 340 to bring this transistor into the conductive state. Therefore, the path between the gate terminal G and the cathode terminal K of the LASCR 110 is short-circuited, and the LASCR 110 is prevented from being erroneously ignited due to the application of the voltage of abrupt rise, in other words, the dv/dt withstand capability is increased.

In case where a voltage in the reverse direction is applied across the anode terminal A and the cathode terminal K of the LASCR 110, current intends to flow through the photodiode 320 as well as the diode 220, but it is blocked by the junction between the n-base layer and p-emitter layer of the LASCR 110.

In case where the control signal is impressed across the gate terminals G1 and G2, the LEDs 20 radiate photons towards the second junction of the LASCR 110 and the p-n junction of the photodiode 320. The LASCR 110 and the photodiode 320 fall into the conductive states by triggering owing to the photons. Because the conductive state of the photodiode 320, the base-emitter path of the transistor 340 is short-circuited, and even when the photons emitted from the LED 20 impinge also on the transistor 340, this transistor holds the non-conductive state. Therefore, while the control signal is kept applied across the gate terminals G1 and G2, the switching sensitivity of the LASCR 110 is maintained high.

In the switching circuit described above, the resistance of the resistor 360 interposed between the gate terminal G and the cathode terminal K of the LASCR 110 was made 35 KΩ. Thus, a dv/dt withstand capability of 2,000 V/μs could be attained.

In the foregoing switching circuit, the photosensitive device disposed between the base and emitter of the transistor 340 has been made the photodiode 320. Thus, it is possible to shorten the distance from the load current carrying portion of a switching circuit which is formed in adjacency to the particular switching circuit, that is, it is possible to enhance the density of integration. In general, a photodiode is inferior in sensitivity to a phototransistor. That is, when equal quantities of photons have been received, the impedance change of the photodiode is much smaller than that of the phototransistor. Even if some of photons radiated from the LEDs being the control portion of the adjacent switching circuit, namely, leakage light impinges on the photodiode erroneously, it cannot perfectly render the photodiode into the conductive state, and the LASCR exhibits the desired dv/dt withstanding capability.

Figure 4:
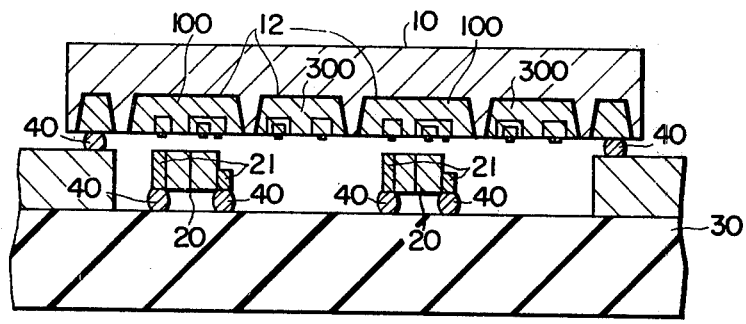
FIG. 4 is a sectional view illustrative of another embodiment according to this invention.
Figure 5:
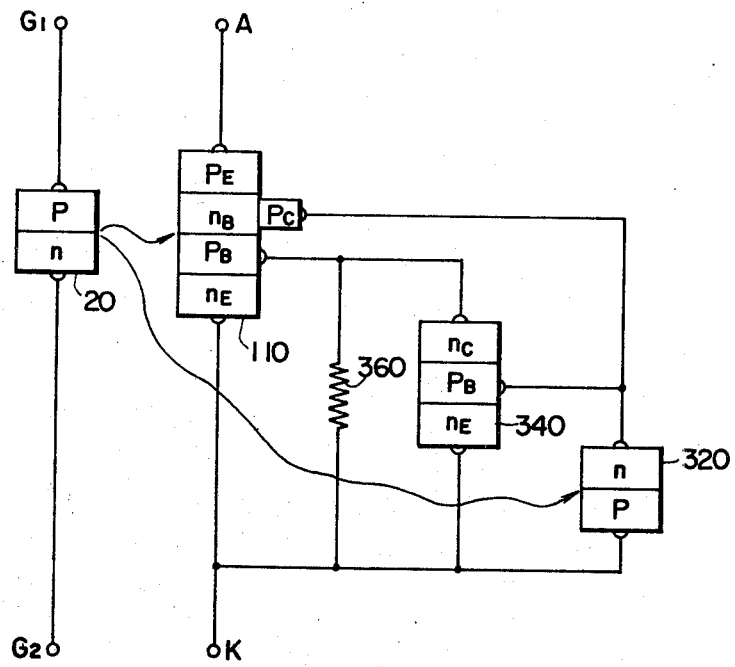
FIG. 5 is a schematic circuit diagram of the embodiment shown in FIG. 4.

FIGS. 4 and 5 illustrate another embodiment of this invention. As seen from these figures, in the present embodiment, the electrode of the LED 20 is provided with a portion for taking out leakage light, for example, a portion with part of the electrode removed. Photons emitted from such an LED 20 impinge on the LASCR 110 and the photodiode 320 which are formed on the dielectric isolated substrate 10. In this embodiment, therefore, only one LED 20 suffices for each switching circuit, which is economically advantageous. Moreover, the size of the whole switching circuit becomes smaller.

FIG. 5 especially shows the switching circuit of this embodiment in a schematic circuit diagram. As already described, one LED 20 is optically coupled with the LASCR 110 and the photodiode 320 in this circuit. On the n-base layer of the LASCR 110, a p-collector layer 111 is further formed. In case where a voltage of abrupt rise is applied across the anode terminal A and the cathode terminal K of the LASCR 110, a capacitive induction current is induced in the junction between the n-base and the p-collector. The present embodiment operates similarly to the switching circuit illustrated in FIGS. 1, 2 and 3.

In the circuit as stated above, the LASCR 110 and the p-collector layer 111 can be formed within the identical isolated region on the IC substrate, so that the density of integration can be enhanced still more.

What we claim:

1. A solid-state switching circuit employing photon coupling, the switching operation of which is controlled by a control signal, comprising:
    at least one light-emitting diode for radiating photons in response to the control signal supplied thereto;
    a light-activated silicon controlled rectifier, the switching operation of which is controlled by the photons radiated from said light-emitting diode;
    a transistor, the collector electrode and the emitter electrode of which are connected to the gate electrode and the cathode electrode of said light-activated silicon controlled rectifier, respectively;
    a diode connected between the n-base layer of said light-activated silicon controlled rectifier and the base electrode of said transistor; and
    a photodiode connected between the base electrode and the emitter electrode of said transistor, and being activated by the photons radiated from said light-emitting diode, thereby said transistor being turned off in response to the appearance of the control signal.

2. A solid-state switching circuit as claimed in claim 1, wherein a resistor is connected between the gate electrode and the cathode electrode of said light-activated silicon controlled rectifier in parallel to said transistor.

3. A solid-state switching circuit employing photon coupling the switching operation of which is controlled by a control signal, comprising:
    at least one light-emitting diode for radiating photons in response to the control signal supplied thereto;
    a light-activated silicon controlled rectifier having a p-collector layer which is formed on the n-base layer thereof, and the switching operation thereof is controlled by the photons radiated from said light-emitting diode;
    a transistor, the collector electrode and the emitter electrode of which are connected to the gate electrode and the cathode electrode of said light-activated silicon controlled rectifier, respectively;
    a conductor connecting the p-collector layer of said light-activated silicon controlled rectifier and the base electrode of said transistor;
    a photodiode connected between the base electrode and the emitter electrode of said transistor, and being controlled by the photons radiated from said light-emitting diode.

4. A solid-state switching circuit as claimed in claim 3, wherein a resistor is connected between the gate electrode and the cathode electrode of said light-activated rectifier in parallel to said transistor.

* * * * *